United States Patent
Shu et al.

(10) Patent No.: US 11,212,914 B2
(45) Date of Patent: Dec. 28, 2021

(54) CIRCUIT BOARD AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Xingjun Shu, Beijing (CN); Jianwu Wu, Beijing (CN); Xi Chen, Beijing (CN); Xinda Li, Beijing (CN); Shengwei Yang, Beijing (CN); Yadong Zhang, Beijing (CN); Jianye Tang, Beijing (CN); Jiaqiang Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 16/622,108

(22) PCT Filed: Apr. 24, 2019

(86) PCT No.: PCT/CN2019/084102
§ 371 (c)(1),
(2) Date: Dec. 12, 2019

(87) PCT Pub. No.: WO2019/214437
PCT Pub. Date: Nov. 14, 2019

(65) Prior Publication Data
US 2020/0137873 A1    Apr. 30, 2020

(30) Foreign Application Priority Data

May 10, 2018 (CN) .......................... 201810443784.3

(51) Int. Cl.
H05K 1/00  (2006.01)
H05K 1/02  (2006.01)
(Continued)

(52) U.S. Cl.
CPC ........... *H05K 1/028* (2013.01); *H05K 1/0237* (2013.01); *H05K 1/09* (2013.01); *H05K 1/115* (2013.01);
(Continued)

(58) Field of Classification Search
CPC .. H05K 1/00; H05K 1/02; H05K 1/09; H05K 1/11; H05K 1/14; H05K 1/18; H05K 3/06;
(Continued)

(56) References Cited

U.S. PATENT DOCUMENTS 3,832,769 A  *  9/1974  Olyphant, Jr. ...... H01L 23/4985
                                                    29/830
5,361,491 A  *  11/1994  Oomachi .............. H01L 21/486
                                                    29/852
(Continued)

FOREIGN PATENT DOCUMENTS

CN        1316871 A      10/2001
CN      101626010 A       1/2010
(Continued)

OTHER PUBLICATIONS

First Office Action dated Jun. 5, 2019, for corresponding Chinese application 201810443784.3.
(Continued)

*Primary Examiner* — Xiaoliang Chen
(74) *Attorney, Agent, or Firm* — Nath, Goldberg & Meyer; Joshua B. Goldberg

(57) ABSTRACT

The present disclosure provides a circuit board, including a substrate on which a first conductive layer and an electronic
(Continued)

device are disposed, wherein the first conductive layer is disposed on a first surface of the substrate, and wherein a bottom end of the electronic device is disposed on the first conductive layer through the substrate. The present disclosure provides a display device.

9 Claims, 2 Drawing Sheets

(51) Int. Cl.
| | |
|---|---|
| H05K 1/09 | (2006.01) |
| H05K 1/11 | (2006.01) |
| H05K 1/14 | (2006.01) |
| H05K 1/18 | (2006.01) |
| H05K 3/06 | (2006.01) |
| H05K 3/12 | (2006.01) |
| H05K 3/40 | (2006.01) |
| H05K 3/46 | (2006.01) |
| H01L 21/02 | (2006.01) |
| H01L 21/44 | (2006.01) |
| H01L 21/48 | (2006.01) |
| H01L 21/56 | (2006.01) |
| H01L 21/60 | (2006.01) |
| H01L 21/607 | (2006.01) |
| H01L 23/02 | (2006.01) |
| H01L 23/06 | (2006.01) |
| H01L 23/34 | (2006.01) |
| H01L 23/36 | (2006.01) |
| H01L 23/42 | (2006.01) |
| H01L 23/48 | (2006.01) |
| H01L 23/52 | (2006.01) |
| H01L 23/495 | (2006.01) |
| H01L 23/498 | (2006.01) |
| H01L 23/538 | (2006.01) |

(52) U.S. Cl.
CPC .............. *H05K 1/118* (2013.01); *H05K 1/147* (2013.01); *H05K 1/189* (2013.01); *H05K 2201/056* (2013.01); *H05K 2201/10128* (2013.01)

(58) Field of Classification Search
CPC ... H05K 3/12; H05K 3/40; H05K 3/46; H01L 21/02; H01L 21/44; H01L 21/48; H01L 21/56; H01L 21/60; H01L 21/607; H01L 23/02; H01L 23/06; H01L 23/34; H01L 23/36; H01L 23/42; H01L 23/48; H01L 23/52; H01L 23/495; H01L 23/498; H01L 23/538
USPC ........ 361/749, 761, 768; 174/250, 252, 253, 174/254, 257, 267; 438/106, 108, 125; 257/684; 29/25.35, 611, 830, 846, 852
See application file for complete search history.

(56) References Cited

U.S. PATENT DOCUMENTS

| | | | | | |
|---|---|---|---|---|---|
| 5,793,105 | A | * | 8/1998 | Pace | H01L 21/485 257/690 |
| 5,849,609 | A | * | 12/1998 | Chun | H01L 23/49827 438/125 |
| 5,886,877 | A | * | 3/1999 | Shingai | H01L 21/4857 361/768 |
| 5,904,499 | A | * | 5/1999 | Pace | H01L 23/053 257/E21.511 |
| 5,937,494 | A | * | 8/1999 | Meyer | H05K 1/118 29/25.35 |
| 6,140,707 | A | * | 10/2000 | Plepys | H01L 23/49816 257/778 |
| 6,170,931 | B1 | * | 1/2001 | Anderson | B41J 2/14072 347/17 |
| 6,442,043 | B1 | * | 8/2002 | Seki | H01L 21/563 174/252 |
| 6,643,923 | B1 | * | 11/2003 | Hishinuma | H01L 21/4853 174/267 |
| 6,774,872 | B1 | | 8/2004 | Kawada et al. | |
| 9,743,511 | B1 | * | 8/2017 | Chen | H05K 3/4691 |
| 9,826,646 | B2 | * | 11/2017 | Munakata | H01L 25/0657 |
| 10,631,399 | B2 | * | 4/2020 | Mayer-Dick | H05K 1/0218 |
| 2001/0009299 | A1 | | 7/2001 | Saito | |
| 2001/0052647 | A1 | * | 12/2001 | Plepys | H01L 21/50 257/738 |
| 2003/0001250 | A1 | * | 1/2003 | Chien-Hung | H01L 31/0203 257/684 |
| 2003/0134450 | A1 | * | 7/2003 | Lee | H01L 23/13 438/106 |
| 2004/0219713 | A1 | * | 11/2004 | Lee | H01L 25/0657 438/106 |
| 2006/0068164 | A1 | * | 3/2006 | Iguchi | H01L 23/4985 428/131 |
| 2007/0158811 | A1 | * | 7/2007 | Wehrly | H01L 23/5388 257/686 |
| 2008/0074852 | A1 | * | 3/2008 | Lee | H01L 25/0657 361/749 |
| 2009/0167735 | A1 | * | 7/2009 | Lee | H01L 23/4985 345/206 |
| 2009/0169773 | A1 | * | 7/2009 | Lee | H05K 1/0326 428/1.1 |
| 2012/0153468 | A1 | * | 6/2012 | Lee | H01L 25/0657 257/737 |
| 2014/0055328 | A1 | * | 2/2014 | Osako | H05K 1/0203 345/87 |
| 2014/0078692 | A1 | * | 3/2014 | Park | H05K 1/0278 361/749 |
| 2014/0138640 | A1 | * | 5/2014 | Kim | H01L 27/3272 257/40 |
| 2014/0218642 | A1 | * | 8/2014 | Iwami | G02F 1/13338 349/12 |
| 2014/0240614 | A1 | * | 8/2014 | Ahn | G06F 3/0412 349/12 |
| 2014/0268594 | A1 | * | 9/2014 | Wang | H05K 1/189 361/749 |
| 2015/0101847 | A1 | * | 4/2015 | Tsai | H05K 3/4691 174/254 |
| 2015/0230331 | A1 | | 8/2015 | Lee | |
| 2016/0128174 | A1 | * | 5/2016 | Lim | H05K 1/189 361/749 |
| 2016/0218079 | A1 | | 7/2016 | Gong et al. | |
| 2018/0063962 | A1 | * | 3/2018 | Lee | G06F 3/0416 |
| 2019/0204651 | A1 | | 7/2019 | Bai et al. | |
| 2020/0137873 | A1 | | 4/2020 | Shu et al. | |

FOREIGN PATENT DOCUMENTS

| | | |
|---|---|---|
| CN | 104582263 A | 4/2015 |
| CN | 104835804 A | 8/2015 |
| CN | 105826353 A | 8/2016 |
| CN | 108008584 A | 5/2018 |
| CN | 108684134 A | 10/2018 |
| EP | 1006505 B1 | 8/2008 |

OTHER PUBLICATIONS

Second Office Action dated Nov. 5, 2019, for corresponding Chinese application 201810443784.3.

\* cited by examiner

CIRCUIT BOARD AND DISPLAY DEVICE

CROSS-REFERENCE TO RELATED APPLICATION

This is a National Phase Application filed under 35 U.S.C. 371 as a national stage of PCT/CN2019/084102, filed on Apr. 24, 2019, an application claiming the benefit of Chinese Application No. 201810443784.3, filed on May 10, 2018, the content of each of which is hereby incorporated by reference in its entirety.

TECHNICAL FIELD

The present disclosure relates to the field of display technology, and particularly relates to a circuit board and a display device.

BACKGROUND

In display devices, various driving signals are transmitted to a display panel through a flexible circuit board. During the signal transmission, factors such as self-resistance of the signal lines on the flexible circuit board, layer switching settings of the signal lines and the like may affect the signal transmission by the signal lines, for example, cause signal delay. As a result, time sequences of different signals are easy to be out of sync, leading to poor display of the display panel.

SUMMARY

According to one aspect of the present disclosure, there is provided a circuit board, including a substrate on which a first conductive layer and an electronic device are disposed, wherein the first conductive layer is disposed on a first surface of the substrate, and wherein a bottom end of the electronic device is connected to the first conductive layer through the substrate.

According to an embodiment of the present disclosure, a plurality of pads are provided on the bottom end of the electronic device so that the plurality of pads are in contact with the first conductive layer.

According to an embodiment of the present disclosure, the first conductive layer includes a plurality of signal lines in contact with a plurality of pads on the electronic device, respectively.

According to an embodiment of the present disclosure, a material of the plurality of signal lines includes copper.

According to an embodiment of the present disclosure, a second conductive layer is further disposed on the substrate, wherein the second conductive layer is disposed on a second surface of the substrate opposite to the first surface, and a top end of the electronic device is located on a side of the first conductive layer facing the second conductive layer.

According to an embodiment of the present disclosure, a first protective layer is provided on a side of the first conductive layer facing away from the substrate, and a second protective layer is provided on a side of the second conductive layer facing away from the substrate.

According to an embodiment of the present disclosure, an adhesive layer is provided between the first conductive layer and the first protective layer, and between the second conductive layer and the second protective layer, respectively.

According to an embodiment of the present disclosure, an antistatic layer is provided on the side of the first conductive layer facing away from the substrate.

According to an embodiment of the present disclosure, the substrate is a flexible substrate.

According to another aspect of the present disclosure, there is provided a display device, including a display panel and the circuit board of the present disclosure, wherein the display panel includes a bonding area, and the bonding area is provided with a bonding electrode to which a first region of the first conductive layer is bonded.

According to an embodiment of the present disclosure, the substrate of the circuit board is a flexible substrate, and a portion of the circuit board is bent to a side of the display panel facing away from a display direction of the display panel.

According to an embodiment of the present disclosure, the display device further includes a driving circuit board connected to a second region of the first conductive layer, wherein the second region is different from the first region.

BRIEF DESCRIPTION OF THE DRAWINGS

Accompanying drawings are provided for further understanding of the disclosure and constitute a part of the specification. Hereinafter, these drawings are intended to explain the disclosure together with the following specific embodiments, but should not be considered as a limitation of the disclosure. In the drawings.

DETAILED DESCRIPTION OF THE EMBODIMENTS

Hereinafter, specific embodiments of the present disclosure will be described with respect to the accompanying drawings. It should be understood that the specific embodiments as set forth herein are merely for the purpose of illustration and explanation of the disclosure and should not be constructed as a limitation thereof.

Figure 1:
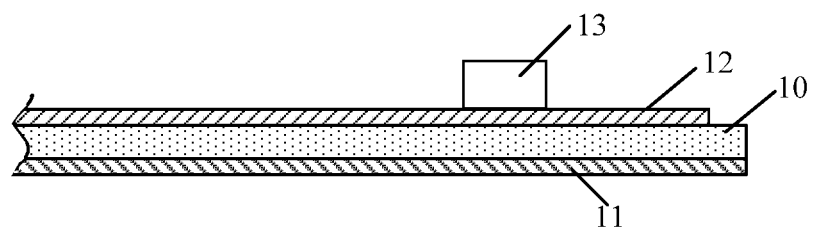
FIG. 1 is a schematic structural diagram of a circuit board.

FIG. 1 is a schematic structural diagram of a circuit board.

As shown in FIG. 1, the circuit board includes a substrate 10, a first conductive layer 11, a second conductive layer 12, and an electronic device 13. The electronic device 13 is disposed on the second conductive layer 12, and may be a resistor, a capacitor, a thin film transistor, or the like. The first conductive layer 11 may be bonded to, for example, a display panel, and transmit a display-related driving signal (e.g., an MIPI signal) from the electronic device 13 to the display panel. Since the electronic device 13 is disposed on the second conductive layer 12, in order to realize such signal transmission, signal lines in the first conductive layer 11 are required to be connected to the electronic device 13.

Figure 2:
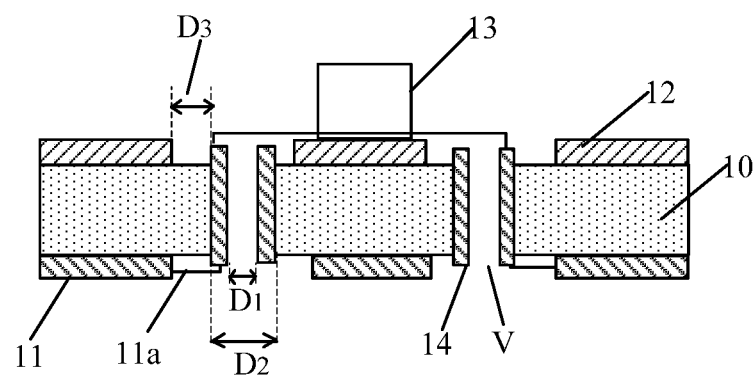
FIG. 2 is a schematic structural diagram of a via hole provided in the circuit board.

FIG. 2 is a schematic structural diagram of a via hole provided in the circuit board.

As shown in FIG. 2, a signal line 11a of the first conductive layer 11 may be connected to the electronic device 13 through a via hole V provided in the circuit board. Since the connection between the signal line 11a and the electronic device 13 is unstable due to a small width of the signal line 11a, a conductive layer may be disposed on an inner wall of the via hole V to form a cylindrical connecting part 14 for a more stable connection. The signal line 11a is connected to the electronic device 13 through the connecting part 14. However, such arrangement of the via hole V and the connecting part 14 will generate parasitic capacitance and parasitic inductance, thereby affecting the signal transmission.

For a via hole V corresponding to any signal line 11a, a safe distance $D_3$ is present between an open edge of the via hole V and other signal lines in the first conductive layer 11, and between the open edge of the via hole V and signal lines in the second conductive layer 12, respectively, so that parasitic capacitance is generated between the connecting part 14 and other signal lines 11a in the first conductive layer 11, and between the connecting part 14 and the signal lines in the second conductive layer 12. The capacitance value of the parasitic capacitance is $C=1.41**\xi*T*D_1/(D_3-D_1)$, where $\xi$ is the dielectric constant of the substrate 10, T is a total thickness of the substrate 10, the first conductive layer 11, and the second conductive layer 12, and $D_1$ is an inner diameter of the connecting part 14. A delay time in the signal due to the parasitic capacitance is $t=2.2*C*(T/2)$. In addition, an inductance value of the parasitic inductance generated by the via hole V and the connecting part 14 provided therein is $L=5.08*h*(\ln(4\ h/D_2)+1)$, where h is a length of the connecting part 14 (i.e., a depth of the via hole V), and $D_2$ is an outer diameter of the connecting part 14 (i.e., a diameter of the via hole V). The parasitic inductance has an equivalent impedance $R=\pi L/t$ during the delay time t, and the equivalent resistance also has an influence on the quality of signal transmission. For example, when a high-frequency current passes through the via hole V, the effect of the equivalent resistance on the high-frequency current cannot be ignored. For example, when $D_1=0.1$ mm, $D_3=0.5$ mm, $=4$, and $T=49$ μm, the capacitance value C of the parasitic capacitance is 0.414 pF, the delay time t is 22.77 ps, the inductance value L of the parasitic inductance is 0.517 nH, and the equivalent impedance is 2.27Ω.

Figure 3:
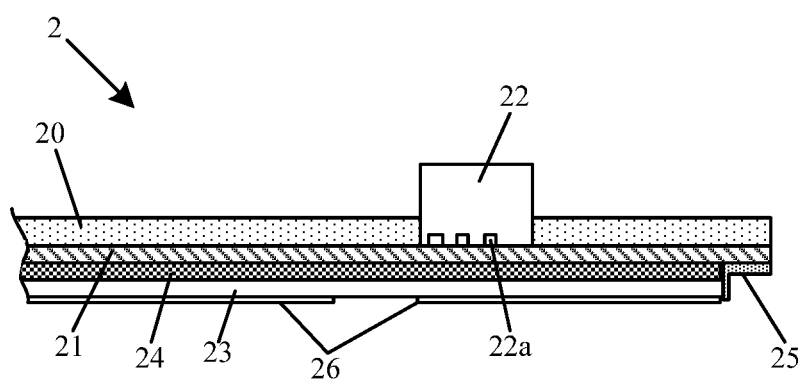
FIG. 3 is a schematic structural diagram of a circuit board according to an embodiment of the present disclosure.

FIG. 3 is a schematic structural diagram of a circuit board according to an embodiment of the present disclosure.

As shown in FIG. 3, the present disclosure provides a circuit board 2 that may not have a via hole structure. The circuit board 2 according to the embodiment of the present disclosure includes a substrate 20, a first conductive layer 21, and an electronic device 22, wherein the first conductive layer 21 and the electronic device 22 are disposed on the substrate 20. Specifically, the first conductive layer 21 is disposed on a first surface of the substrate 20, and one region (e.g., the region where a bonding electrode 25 is formed) of the first conductive layer 21 may be bonded to a bonding electrode of, for example, a display panel. A bottom end of the electronic device 22 is disposed on the first conductive layer 21 through the substrate 20. For example, the bottom end of the electronic device 22 may be disposed on the first conductive layer 21 by a Surface Mount Technology (SMT).

According to an embodiment of the present disclosure, the electronic device 22 may be a resistor, a capacitor, a transistor, or the like.

According to an embodiment of the present disclosure, pads 22a are provided on the bottom end of the electronic device 22 so that the pads 22a are in contact with the first conductive layer 21. The first conductive layer 21 may include a plurality of signal lines so that the pads 22a are in contact with the plurality of signal lines in the first conductive layer 21, respectively.

Referring back to FIG. 2, since the electronic device 13 is disposed on the second conductive layer 12, when the signal line 11a in the first conductive layer 11 is connected to the electronic device 13 through the via hole V, a length of trace (not shown) is required between a pad (not shown) of the electronic device 13 in contact with the second conductive layer 12 and the connecting part 14 in the via hole V. The trace may have an influence on the flatness and distribution density of the signal lines in the second conductive layer 12. In contrast to the arrangement of the circuit board in FIG. 2, according to the embodiment of the present disclosure, the pads 22a of the electronic device 22 in the circuit board 2 are in direct contact with the signal lines in the first conductive layer 21, thereby avoiding the influence on the signal lines in the second conductive layer.

Referring back to FIG. 3, a first protective layer 23 is provided on a side of the first conductive layer 21 facing away from the substrate 20, and an adhesive layer 24 may be provided between the first protective layer 23 and the first conductive layer 21. The first protective layer 23 is configured to protect the first conductive layer 21 from external moisture. In addition, an antistatic layer 26 may be further provided on the side of the first conductive layer 21 facing away from the substrate 20 to prevent the signal lines of the first conductive layer 21 from being interfered by static electricity.

According to an embodiment of the present disclosure, the substrate 20 has a thickness between about 20 μm and about 30 μm. For example, the substrate 20 may have a thickness of about 25 μm. The first conductive layer 21 may have a thickness between about 10 μm and about 15 μm. For example, the first conductive layer 21 may have a thickness of about 12.5 μm. The first protective layer 23 and the adhesive layer 24 may each have a thickness between about 10 μm and about 15 μm. For example, the first protective layer 23 may have a thickness of about 12.5 μm, the adhesive layer 24 may have a thickness of about 15 μm, and the antistatic layer 26 may have a thickness of about 10 μm.

Figure 4:
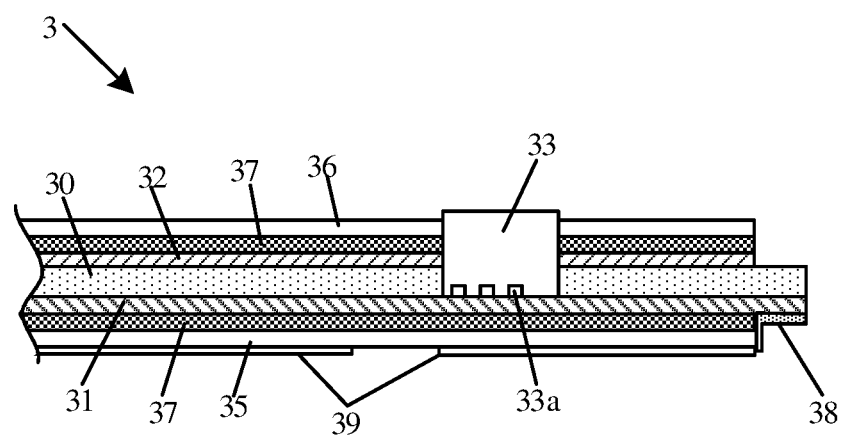
FIG. 4 is a schematic structural diagram of a circuit board according to an embodiment of the present disclosure.

FIG. 4 is a schematic structural diagram of a circuit board according to another embodiment of the present disclosure.

Referring to FIG. 4, a circuit board 3 according to another embodiment of the present disclosure includes a substrate 30, a first conductive layer 31, a second conductive layer 32, and an electronic device 33. The first conductive layer 31, the second conductive layer 32, and the electronic device 33 are disposed on the substrate 30. Specifically, the first conductive layer 31 is disposed on a first surface of the substrate 30, the second conductive layer 32 is disposed on a second surface of the substrate 30 opposite to the first surface, one region (e.g., the region where a bonding electrode 38 is formed) of the first conductive layer 31 may be bonded to a bonding electrode of, for example, a display panel, a bottom end of the electronic device 33 is disposed on the first conductive layer 31 through the substrate 30, and a top end of the electronic device 33 is located on a side of the first conductive layer 31 facing the second conductive layer 32.

Similar to the electronic device 22 shown in FIG. 3, pads 33a are provided on the bottom end of the electronic device 33 so that the pads 33a are in contact with the first conductive layer 31. The first conductive layer 31 may include a plurality of signal lines so that the pads 33a are in contact with the plurality of signal lines in the first conductive layer 31, respectively. In addition, similar to the first conductive layer 31, the second conductive layer 32 may also include a plurality of signal lines as traces. The signal lines in the first conductive layer 31 and the second conductive layer 32 may be made of, for example, copper.

Referring back to FIG. 2, since the electronic device 13 is disposed on the second conductive layer 12, when the signal line 11a in the first conductive layer 11 is connected to the electronic device 13 through the via hole V, a length of trace (not shown) is required between a pad (not shown) of the electronic device 13 in contact with the second conductive layer 12 and the connecting part 14 in the via hole V. The trace may have an influence on the flatness and distribution density of the signal lines in the second conductive layer 12. In contrast to the arrangement of the circuit board in FIG. 2, according to the embodiment of the present disclosure, the pads 33a of the electronic device 33 in the circuit board 3 are in direct contact with the signal lines in the first conductive layer 31, thereby avoiding the influence on the signal lines in the second conductive layer 32.

Referring back to FIG. 4, similar to the circuit board 2 shown in FIG. 3, a first protective layer 35 is provided on a side of the first conductive layer 31 facing away from the substrate 30, and an adhesive layer 37 is provided between the first protective layer 35 and the first conductive layer 31. The first protective layer 35 may protect the first conductive layer 31 from external moisture. An antistatic layer 39 is further provided on the side of the first conductive layer 31 facing away from the substrate 30 to prevent the signal lines of the first conductive layer 31 from being interfered by static electricity. In addition, a second protective layer 36 is provided on a side of the second conductive layer 32 facing away from the substrate 30, and an adhesive layer 37 is also provided between the second protective layer 36 and the second protective layer 32. The second protective layer 36 may protect the second conductive layer 32 from external moisture.

According to an embodiment of the present disclosure, the substrate 30 has a thickness between about 20 μm and about 30 μm. For example, the substrate 30 may have a thickness of about 25 μm. The first conductive layer 31 and the second conductive layer 32 may each have a thickness between about 10 μm and about 15 μm. For example, the first conductive layer 31 and the second conductive layer 32 may each have a thickness of about 12.5 μm. The first protective layer 35, the second protective layer 36, and the two adhesive layers 37 may each have a thickness between about 10 μm and about 15 μm. For example, the first protective layer 35 and the second protective layer 36 may each have a thickness of about 12.5 μm, the two adhesive layers 37 may each have a thickness of about 15 μm, and the antistatic layer 39 may have a thickness of about 10 μm.

In the circuit board 3 according to the embodiment of the present disclosure, since a bottom end of the electronic device 33 is directly disposed on the first conductive layer 31 so that the pads 33a of the electronic device 33 are in contact with the first conductive layer 31, the via hole in the circuit board and thus the connecting part in the via hole are not necessary, thereby avoiding the influence on the signal transmission due to parasitic capacitance and parasitic resistance generated from the provision of the via hole and the connecting part (e.g., signal delay, etc.), and thus reducing poor display of the display panel resulting from the affected signal transmission (e.g., signal delay, etc.). In addition, the bottom end of the electronic device 33 directly disposed on the first conductive layer 31 can further reduce the overall thickness of the circuit board 3.

In addition, for the circuit board 3 according to the embodiment of the present disclosure, the manufacturing process of the circuit board 3 may be simplified, and a transmission path of the signal lines may be shortened, thereby reducing the interference to the signal lines, eliminating the need for arranging many anti-interference electrostatic shielding layers, and thus reducing the production cost. The substrate 20 in the circuit board 2 shown in FIG. 3 and the substrate 30 in the circuit board 3 shown in FIG. 4 may be both flexible substrates, and the material thereof may include, for example, polyimide (PI). While assembling the circuit board with the flexible substrate and the display panel, the circuit board may be bent to the back of the display panel after the one region of the first conductive layer is bonded to the bonding electrode of the display panel.

Figure 5:
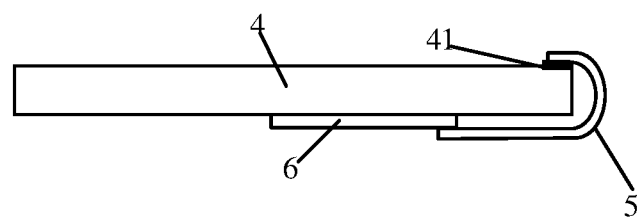
FIG. 5 is a schematic structural diagram of a display device according to an embodiment of the present disclosure.

FIG. 5 is a schematic structural diagram of a display device according to an embodiment of the present disclosure.

Referring to FIG. 5, the display device includes a display panel 4 and a circuit board 5. The circuit board 5 may be the circuit board 2 shown in FIG. 3 or the circuit board 3 shown in FIG. 4. The display panel 4 includes a display area and a bonding area at a periphery of the display area. The bonding area is provided with a bonding electrode 41 to which the first conductive layer of the circuit board 5 may be bonded through a first region of the first conductive layer. For example, the first conductive layer of the circuit board 5 may be bonded to the bonding electrode 41 of the display panel 4 through the bonding electrode in the first region of the first conductive layer. For example, the first conductive layer 21 of the circuit board 2 as shown in FIG. 3 may be bonded to the bonding electrode 41 of the display panel 4 through the bonding electrode 25 in the first region of the first conductive layer 21, or the first conductive layer 31 of the circuit board 3 as shown in FIG. 4 may be bonded to the bonding electrode 41 of the display panel 4 through the bonding electrode 38 in the first region of the first conductive layer 31.

In addition, the circuit board 5 is bent toward the back of the display panel 4 so that a portion of the circuit board 5 is bent to a side of the display panel 4 away from a display direction of the display panel. The display device may be a liquid crystal display device, an OLED display device, or the like. In case that the display device is a liquid crystal display device, a portion of the circuit board 5 is bent to a side of the backlight away from a light emitting direction.

The display device further includes a driving circuit board 6 which is connected to a second region of the first conductive layer of the circuit board 5, and which provides a driving signal for the display panel 4 of the circuit board 5. The second region of the first conductive layer of the circuit board 5 is different from the first region.

In the circuit board according to the embodiment of the present disclosure, since the electronic device is no longer connected to the first conductive layer through the via hole, the influence (e.g., signal delay, etc.) on signal transmission due to the provision of the via hole is reduced, and thus, in the display device using the circuit board according to the embodiment of the present disclosure, poor display due to signal delay or the like is reduced, thereby improving the display effect.

It should be understood that the above embodiments are merely exemplary embodiments for the purpose of illustrating the principle of the disclosure, and the disclosure is not limited thereto. It will be apparent to those skilled in the art that various modifications and variations can be made to the disclosure without departing from the spirit or essence of the disclosure. Such modifications and variations should also be considered as falling into the protection scope of the disclosure.

What is claimed is:

1. A circuit board, comprising a substrate on which a first conductive layer and an electronic device are disposed,
   wherein the first conductive layer is disposed on a first surface of the substrate, and
   wherein a bottom end of the electronic device passes through the substrate and connects to the first conductive layer,
   wherein a second conductive layer is further disposed on the substrate,
   wherein the second conductive layer is disposed on a second surface of the substrate opposite to the first surface, and a top end of the electronic device is located on a side of the first conductive layer facing the second conductive layer,
   wherein a first protective layer is provided on a side of the first conductive layer facing away from the substrate, and a second protective layer is provided on a side of the second conductive layer facing away from the substrate; and
   wherein an adhesive layer is provided between the first conductive layer and the first protective layer, and between the second conductive layer and the second protective layer, respectively.

2. The circuit board according to claim 1, wherein a plurality of pads are provided on the bottom end of the electronic device so that the plurality of pads are in contact with the first conductive layer.

3. The circuit board according to claim 2, wherein the first conductive layer comprises a plurality of signal lines in contact with the plurality of pads on the electronic device, respectively.

4. The circuit board according to claim 3, wherein a material of the plurality of signal lines comprises copper.

5. The circuit board according to claim 1, wherein an antistatic layer is provided on the side of the first conductive layer facing away from the substrate.

6. The circuit board according to claim 1, wherein the substrate is a flexible substrate.

7. A display device, comprising a display panel and the circuit board according to claim 1, wherein the display panel comprises a bonding area, and the bonding area is provided with a bonding electrode to which the first region of the first conductive layer is bonded.

8. The display device according to claim 7, wherein the substrate of the circuit board is a flexible substrate, and a portion of the circuit board is bent to a side of the display panel facing away from a display direction of the display panel.

9. The display device according to claim 7, further comprising a driving circuit board connected to a second region of the first conductive layer, wherein the second region is different from the first region.

* * * * *